United States Patent
Wang et al.

(10) Patent No.: US 12,178,022 B2
(45) Date of Patent: Dec. 24, 2024

(54) MANIFOLD MICROCHANNEL HEAT SINK BASED ON DIRECTIONAL OPTIMIZATION OF HOTSPOT AREA

(71) Applicant: Huazhong University of Science and Technology, Wuhan (CN)

(72) Inventors: Zhiqiang Wang, Wuhan (CN); Yu Liao, Wuhan (CN); Guoqing Xin, Wuhan (CN); Xiaojie Shi, Wuhan (CN); Yong Kang, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 119 days.

(21) Appl. No.: 18/190,751

(22) Filed: Mar. 27, 2023

(65) Prior Publication Data

US 2024/0284644 A1    Aug. 22, 2024

(30) Foreign Application Priority Data

Feb. 21, 2023 (CN) .......................... 202310142336.0

(51) Int. Cl.
*H05K 7/20* (2006.01)

(52) U.S. Cl.
CPC ..... *H05K 7/20918* (2013.01); *H05K 7/20145* (2013.01); *H05K 7/20272* (2013.01); *H05K 7/20927* (2013.01)

(58) Field of Classification Search
CPC ... H01L 23/473; H01L 23/467; H01L 23/367; H01L 23/36; H05K 7/20927; H05K 7/20272; H05K 7/20254; H05K 7/20; H05K 7/20154; H05K 7/209; H05K 7/2089

See application file for complete search history.

(56) References Cited

U.S. PATENT DOCUMENTS

| | | | | |
|---|---|---|---|---|
| 5,002,123 | A * | 3/1991 | Nelson | F28F 13/08 257/E23.098 |
| 9,941,189 | B2 * | 4/2018 | Brunschwiler | H01L 23/473 |

(Continued)

FOREIGN PATENT DOCUMENTS

| | | |
|---|---|---|
| CN | 208157395 U | 11/2018 |
| CN | 110425914 A | 11/2019 |

(Continued)

*Primary Examiner* — Adam B Dravininkas
(74) *Attorney, Agent, or Firm* — Nitin Kaushik

(57) ABSTRACT

The present disclosure relates to the technical field of heat dissipation for electronic devices, and discloses a manifold microchannel heat sink based on directional optimization of hotspot areas, including a power module, a heat dissipation substrate, a cold source device, and a diverter manifold; the heat dissipation substrate is arranged on the power module, a microchannel is provided on a side of the heat dissipation substrate away from the power module and on a back of a heat generating area of the power module for carrying the power module and dissipating heat from the power module. According to the manifold microchannel heat sink based on the directional optimization of hotspot areas, the local heat dissipation performance of the power module may be preliminarily changed by optimizing the microchannel on the heat dissipation substrate, which avoids poor heat dissipation temperature uniformity in a multi-heat source system.

3 Claims, 6 Drawing Sheets

(56) References Cited

U.S. PATENT DOCUMENTS

| | | | | |
|---|---|---|---|---|
| 2006/0108098 A1* | 5/2006 | Stevanovic | ............ | H01L 23/473 |
| | | | | 257/E23.098 |
| 2017/0092565 A1* | 3/2017 | Chen | .................. | H05K 7/20281 |
| 2020/0131637 A1* | 4/2020 | Chen | ................. | C23C 16/45563 |
| 2021/0176896 A1* | 6/2021 | Yang | .................. | H05K 7/20636 |
| 2021/0239310 A1* | 8/2021 | Zhou | ..................... | H01L 23/467 |
| 2022/0142013 A1* | 5/2022 | Zhou | ........................ | F28F 3/12 |
| | | | | 361/702 |

FOREIGN PATENT DOCUMENTS

| | | | |
|---|---|---|---|
| CN | 112084591 | A | 12/2020 |
| CN | 112367809 | A | 2/2021 |
| CN | 113776367 | A | 12/2021 |
| CN | 217308113 | U | 8/2022 |

\* cited by examiner

MANIFOLD MICROCHANNEL HEAT SINK BASED ON DIRECTIONAL OPTIMIZATION OF HOTSPOT AREA

CROSS-REFERENCE TO RELATED APPLICATIONS

The application claims priority to Chinese patent application No. 202310142336.0, filed on Feb. 21, 2023, the entire contents of which are incorporated herein by reference.

TECHNICAL FIELD

The present disclosure relates to the technical field of heat dissipation for electronic devices and, more particularly, to a manifold microchannel heat sink based on directional optimization of hotspot areas.

BACKGROUND

Transportation electrification has promoted the development of power electronic converters towards miniaturization and light weight. The power density of a power electronic converter keeps increasing, which brings about an even worse problem of heat dissipation. Moreover, with the large-scale application of a new generation of wide-bandgap semiconductor materials (e.g., GaN, and SiC), the package size of devices is further reduced. In the case of the same loss, a surface heat flux density of a chip is much higher than that of Si-based devices, which is more likely to cause heat accumulation. Among the failure factors of power semiconductors, failures induced by temperature factors account for the largest proportion, and for every 10° C. increase in junction temperature, the failure rate will double (that is, the "10° C. increase=half life" rule). In addition, the heat dissipation system usually takes up a high proportion of weight and volume in a power electronic converter, and the heat dissipation capacity per unit weight or volume has a decisive impact on the power density indicators of the converter. Therefore, it is of great significance to develop an efficient cooling system.

Most of the traditional converters adopt multi-heat source systems, and the conventional heat dissipation design lacks consideration of the temperature uniformity of the multi-heat source system, which can easily cause the temperature imbalance of the power module chip inside the converter and affect its reliability. In addition, excessive cooling fluid inside the heat sink is distributed in a lower-temperature area, which reduces the overall heat dissipation efficiency and is not conducive to further improving the power density indicators of the converter. Therefore, a manifold microchannel heat sink based on directional optimization of hotspot areas is provided to solve the above technical problem.

SUMMARY

(1) Technical Problem to be Solved

In view of the problem in the prior art, the present disclosure provides a manifold microchannel heat sink based on directional optimization of hotspot areas, with the advantages of directionally enhanced cooling based on hotspot areas and high heat dissipation efficiency, and solves the problem that most of the traditional converters adopt multi-heat source systems, and the conventional heat dissipation design lacks consideration of the temperature uniformity of the multi-heat source system, which can easily cause the temperature imbalance of the power module chip inside the converter and affect its reliability and the problem that excessive cooling fluid inside the heat sink is distributed in a lower-temperature area, which reduces the overall heat dissipation efficiency and is not conducive to further improving the power density indicators of the converter.

(2) Technical Solution

To achieve the object of directionally enhanced cooling based on hotspot areas and high heat dissipation efficiency, the present disclosure provides the following technical solution: a manifold microchannel heat sink based on directional optimization of hotspot areas, including a power module, further including a heat dissipation substrate, a cold source device, and a diverter manifold; the heat dissipation substrate is arranged on the power module, and a microchannel is provided on a side of the heat dissipation substrate away from the power module and on a back of a heat generating area of the power module for carrying the power module and dissipating heat from the power module; the cold source device is spaced from the heat dissipation substrate and is configured to generate a cold flow and dissipate heat from the heat dissipation substrate; the diverter manifold (4) is arranged between the heat dissipation substrate and the cold source device, communicates with the microchannel on the heat dissipation substrate to form a heat dissipation channel, and is configured to cooperate with the cold source device to perform directionally enhanced cooling on the heat dissipation substrate.

Preferably, the diverter manifold includes a partition plate, a zigzag strip protrusion, a flow inlet, and a flow outlet: the partition plate is arranged on a side of the heat dissipation substrate away from the power module, and seals an edge of the microchannel; the zigzag strip protrusion is arranged on a side of the partition plate away from the heat dissipation substrate, and a side wall of the zigzag strip protrusion renders a cross-section of the heat dissipation channel to be a gradually contracted trapezoidal structure; the flow inlet communicating with the microchannel is provided on the partition plate and on a concave area side of the zigzag strip protrusion, and the flow inlet communicates with the cold source device; and the flow outlet communicating with the microchannel is provided on the partition plate and on a convex area side of the zigzag strip protrusion.

Preferably, a number, a width, and a position of the flow inlet and the flow outlet on the partition plate in a case of optimal heat dissipation are calculated by combining finite element software simulation and optimization algorithms.

Preferably, the cold source device is an air-cooling device, and the cold source device includes a first base and a fan; the first base is arranged on a side of the partition plate away from the heat dissipation substrate, and abuts against the zigzag strip protrusion on the partition plate so that the first base is divided into an air intake area and an air exhaust area; and the fan is arranged in the air intake area on the first base.

Preferably, the cold source device is a water-cooling device, and the cold source device includes a second base, a cooling cavity, a water inlet, and a water outlet; the second base is arranged on a side of the partition plate away from the heat dissipation substrate; the cooling cavity is provided in the second base, and the zigzag strip protrusion abuts against an inner wall of the cooling cavity and divides the cooling cavity into a left cavity and a right cavity, the left cavity and the right cavity being communicated through the flow inlet, the microchannel, and the outlet; a water inlet communicating with the left cavity is provided on the second base; and a water outlet communicating with the right cavity is provided on the second base.

Preferably, a heat source of a circuit on the beat dissipation substrate is analyzed, and a number, a size, a topological shape, and a position of the microchannel in a case of optimal heat dissipation are calculated by combining finite element software simulation and optimization algorithms.

Preferably, the heat dissipation substrate, the cold source device, and the diverter manifold are detachably assembled and connected through bolts, and can also be integrally formed through 3D printing, metal bonding, etc.

(3) Advantageous Effects

Compared with the prior art, the present disclosure provides a manifold microchannel heat sink based on directional optimization of hotspot areas, which has the following advantageous effects.

1. According to the manifold microchannel heat sink based on the directional optimization of hotspot areas, the local heat dissipation performance of the power module may be preliminarily changed by optimizing the microchannel on the heat dissipation substrate, which avoids poor heat dissipation temperature uniformity in a multi-heat source system; with the diverter manifold cooperating with the cold source device, inflow and outflow positions of a cold flow inside the microchannel are changed on a basis of characteristics of a heat source layout, which may further ensure a directionally enhanced cooling effect, that is, the directional enhanced cooling effect based on the hotspot area is provided while enabling high efficiency of heat dissipation.

2. According to the manifold microchannel heat sink based on the directional optimization of hotspot areas, the partition plate, the zigzag strip protrusion, the flow inlet, and the flow outlet cooperate through the diverter manifold, thereby changing the flow distribution of a cold flow at different positions in the diverter manifold and the heat transfer efficiency; moreover, a flow direction of a fluid in the diverter manifold is perpendicular to a flow direction in the microchannel, which can maximize the disturbance of the fluid, thereby improving the heat transfer coefficient; in addition, the cold source device may be an air-cooling device or a water-cooling device, which further broadens the scope of application of the manifold microchannel heat sink.

Figure 1:
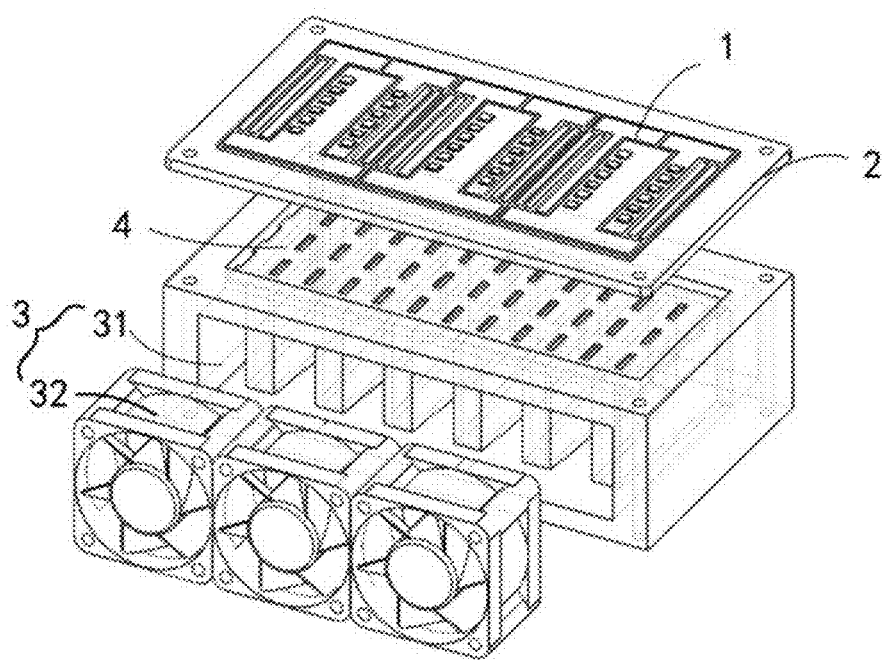
FIG. 1 is an exploded view of a manifold microchannel heat sink in an embodiment of the present disclosure.

Reference numerals: 1—power module, 2—heat dissipation substrate, 3—cold source device, 31—first base, 32—fan, 4—diverter manifold, 41—partition plate, 42—zigzag strip protrusion, 43—flow inlet. 44—flow outlet, a—air intake area, b—air exhaust area, c—left cavity, d—right cavity.

DETAILED DESCRIPTION OF THE EMBODIMENTS

The technical solution in the embodiments of the present disclosure will be described fully and clearly with reference to the accompanying drawings in the embodiments of the present disclosure. Apparently, the described embodiments are only some, not all, embodiments of the present disclosure. On the basis of the embodiments of the present disclosure, all other embodiments obtained by persons of ordinary skill in the art without inventive efforts shall fall within the scope of the present disclosure.

Embodiment 1

Figure 2:
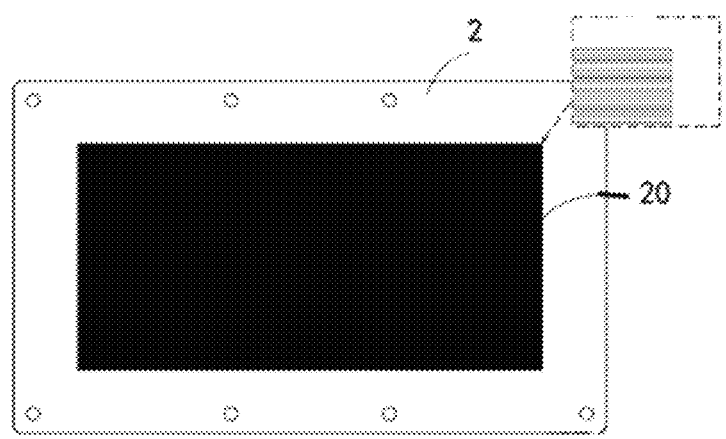
FIG. 2 is a schematic structural view of a heat dissipation substrate in the present disclosure.
Figure 3:
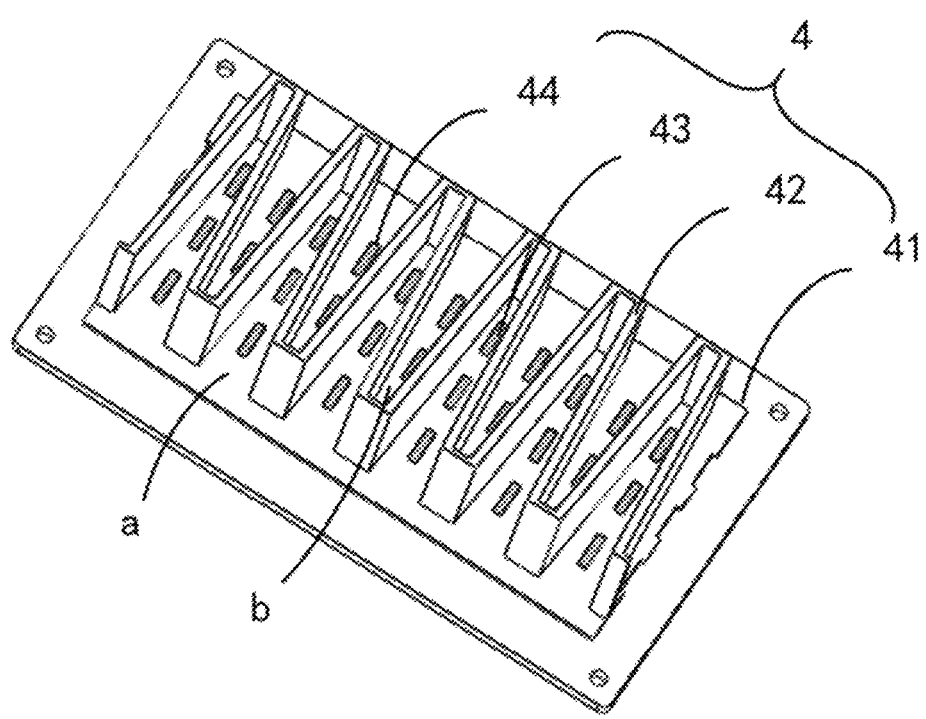
FIG. 3 is a perspective view of a structure of a diverter manifold in the present disclosure.

With reference to FIGS. 1 to 3, a manifold microchannel heat sink based on the directional optimization of hotspot areas is provided, including a power module 1, further including a heat dissipation substrate 2, a cold source device 3, and a diverter manifold 4; the cold source device 3 is an air-cooling device, and the cold source device 3 includes a first base 31 and a fan 32; the fan 32 is fixedly installed in the first base 31; the heat dissipation substrate 2 is fixedly installed on the power module 1 for carrying the power module 1; a microchannel 20 is provided on a side of the heat dissipation substrate 2 away from the power module 1 and on a back of a heating area of the power module 1; the microchannel 20 is configured to enhance the heat dissipation efficiency of the power module 1. The cold source device 3 is spaced from the heat dissipation substrate 2 and is configured to generate a cold air flow for dissipating heat from the heat dissipation substrate 2 and the power module 1; the diverter manifold 4 is fixedly installed in the first base 31 on the cold source device 3 and fixedly connected to the heat dissipation substrate 2, and the diverter manifold 4 communicates with the microchannel 20 on the heat dissipation substrate 2 and forms a heat dissipation channel 40; the fan 32 on the cold source device 3 rotates at a high speed and generates a cold air flow, and guides the flow in cooperation with the heat dissipation substrate 2 through the diverter manifold 4, so that the cold air flow passes through the heat dissipation channel 40 and the microchannel 20 and performs directionally enhanced cooling on the heating area of the power module 1. As such, a situation where the cold air flow is distributed in a lower-temperature area and the overall heat dissipation efficiency is reduced is avoided, or a situation of unbalanced heat dissipation temperature of the power module chip inside a converter is avoided, thereby achieving directionally enhanced cooling of hotspot areas and high heat dissipation efficiency.

Preferably, to further improve the heat dissipation performance of the manifold microchannel heat sink, specifically, the diverter manifold 4 includes a partition plate 41, a zigzag strip protrusion 42, a flow inlet 43, and a flow outlet 44; the partition plate 41 is fixedly installed on a side of the heat dissipation substrate 2 away from the power module 1 and seals an edge of the microchannel 20 to avoid an overflow or turbulence of the cold air flow, which affect the heat dissipation performance of the manifold microchannel heat sink. The zigzag strip protrusion 42 is arranged on a side of the partition plate 41 away from the heat dissipation substrate 2. A side wall of the zigzag strip protrusion 42 renders a cross-section of the heat dissipation channel 40 to be a tapered trapezoidal structure. The flow inlet 43 communicating with the microchannel 20 is provided on the partition plate 41 and on a concave area side of the zigzag strip protrusion 42, and the flow inlet 43 communicates with a flow outlet of the cold source device 3: the zigzag strip protrusion 42 abuts against the zigzag strip protrusion 42 on the partition plate 41 so that the first base 31 is divided into an air intake area a and an air exhaust area b; the fan 32 is fixedly installed in the air intake area a on the first base 31: the flow outlet 44 communicating with the microchannel 20 is provided on the partition plate and on a convex area side of the zigzag strip protrusion 42. The cold air flow generated by the cold source device 3 is guided by the side wall of the zigzag strip protrusion 42, and the uniformity of fluid distribution in the channel is improved; the cold air flow is introduced into the microchannel 20 through the flow inlet 43 on the partition plate 41 to cool the heat dissipation substrate 2, and the heated air after heat transfer in the microchannel 20 is exported through the flow outlet 44 on the partition plate 41 to realize rapid cooling. Since the partition plate 41 cooperates with the flow inlet 43 and the flow outlet 44 to guide the cold air flow up and down, and through the microchannel 20, the cold air flow entering the heat dissipation substrate 2 is three-dimensionally directed, a flow direction of the cold air flow in the diverter manifold 4 is perpendicular to a flow direction in the microchannel 20, which can maximize the disturbance of the fluid, thereby increasing a heat transfer coefficient and extending a flow path of the cold air flow, as a result, the heat transfer efficiency of the cold air flow is relatively improved. In addition, between the zigzag strip protrusion 42 on the diverter manifold 4 and the partition plate 41, and between the partition plate 41 and the heat dissipation substrate 2, heat transfer by contact is possible so that the cold air flow entering the microchannel 20 performs preliminary heat transfer on a side of the zigzag strip protrusion 42, and the cold air flow out of the microchannel 20 performs secondary heat transfer on the other side of the zigzag strip protrusion 42, which further increases the heat transfer area and heat transfer efficiency of the manifold microchannel heat sink, and achieves directionally enhanced cooling based on hot-spot areas and high heat dissipation efficiency.

Preferably, to further improve the heat dissipation performance of the manifold microchannel heat sink, specifically, a number, a width, and a position of the flow inlet 43 and the flow outlet 44, and a number and a position of the microchannels 10 on the partition plate 41 in a case of optimal heat dissipation are calculated by combining finite element software simulation and optimization algorithms, thereby further optimizing the heat dissipation performance of the manifold microchannel heat sink. Based on the LiveLink for MATLAB interface of COMSOL, a finite element simulation software, specific coding rules are used to represent different structures and shapes of the diverter manifold, and CFD simulations are performed for each structure and shape; the simulation results are repeatedly screened, altered, and iterated until reaching a convergence to an optimum solution. Upon experimental verification, the optimized manifold microchannel heat sink can control the temperature non-uniformity between chips with the same loss within 5%. The heat dissipation efficiency of the manifold microchannel heat sink based on directional optimization of hotspot areas is higher than that of the traditional manifold microchannel heat sink. In the case of the same chip loss and the same flow conditions, the solution herein may reduce the system heat resistance by 10-20%.

Preferably, to further improve the heat dissipation performance of the manifold microchannel heat sink, specifically, the heat dissipation substrate 2, the cold source device 3, and the diverter manifold 4 are assembled and connected detachably through bolts so that the interior of the manifold microchannel heat sink is easily cleaned regularly to avoid a situation where stains on the inner wall of the microchannel 20 and the heat dissipation channel 40 affect the heat dissipation performance of the manifold microchannel heat sink.

Embodiment 2

Figure 4:
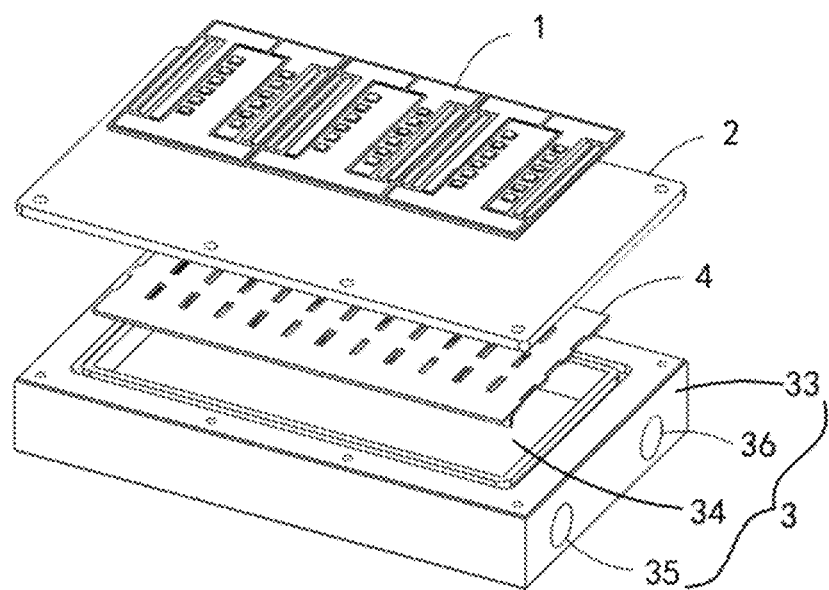
FIG. 4 is an exploded view of the manifold microchannel heat sink in Embodiment 2 of the present disclosure.
Figure 5:
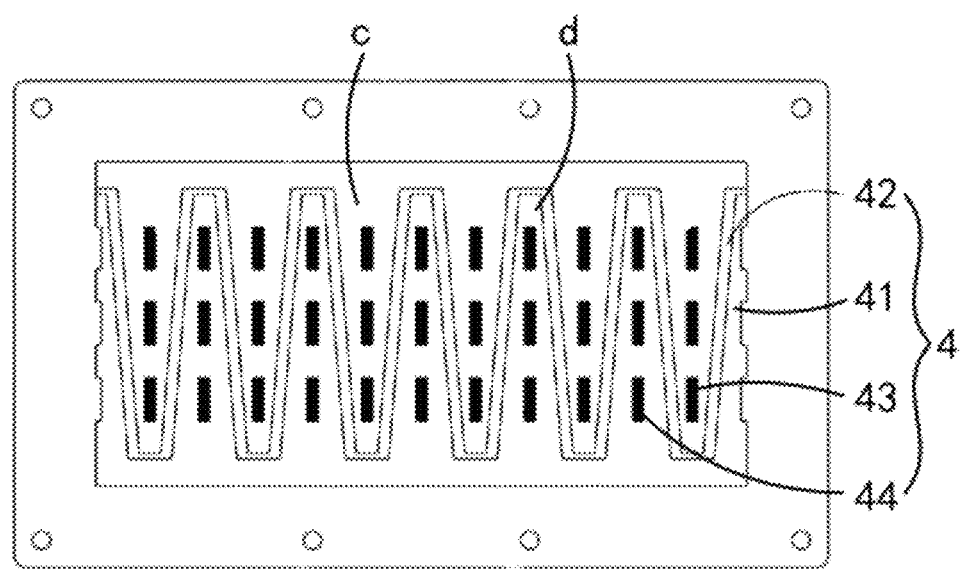
FIG. 5 is a bottom view of a structure of the diverter manifold in the present disclosure.
Figure 6:
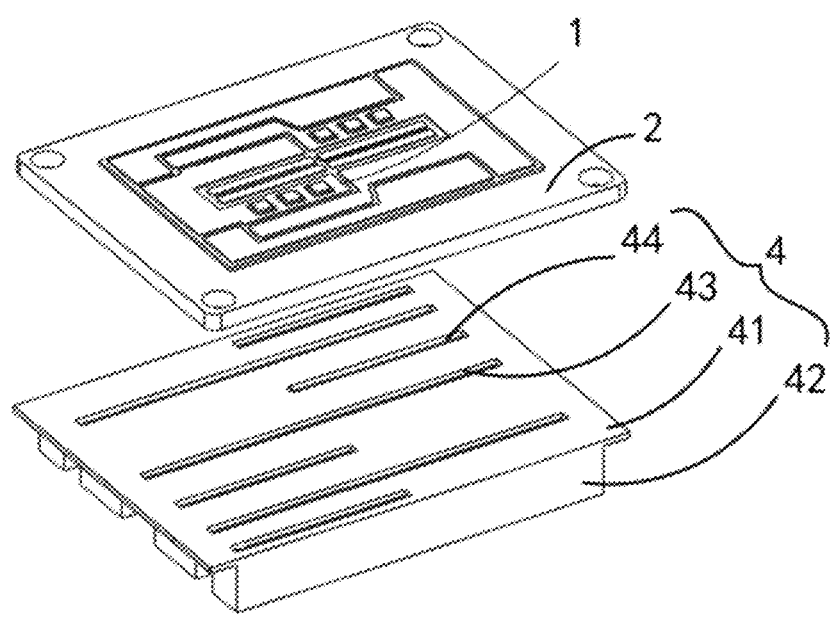
FIG. 6 is an exploded view of a partial structure of the manifold microchannel heat sink in the present disclosure.

With reference to FIGS. 4 to 6, Embodiment 2 differs from Embodiment 1 only in that the cold source device 3 in Embodiment 2 is a water-cooling device, the cold source device 3 is a water-cooling device, and the cold source device 3 includes a second base 33, a cooling cavity 34, a water inlet 35, and a water outlet 36; the second base 33 is fixedly installed on a side of the partition plate 41 away from the heat dissipation substrate 2, and the cooling cavity 34 is provided in the second base 33; the zigzag strip protrusion 42 abuts against an inner wall of the cooling cavity 34 and the cooling cavity 34 is divided into a left cavity c and a right cavity d. The left cavity e and the right cavity d are communicated through the flow inlet 43, the microchannel 20, and the flow outlet 44. The second base 33 is provided with the water inlet 35 communicating with the left cavity c, and the second base 33 is provided with the water outlet 36 communicating with the right cavity d; the cooling cavity 34 is filled with a cooling liquid, and the cooling liquid is an ethylene glycol solution; the cooling liquid is introduced into the left cavity c of the cooling cavity 34 through the water inlet 35, and the cooling liquid is introduced into the microchannel 20 of the heat dissipation substrate 2 through the flow inlet 43 on the partition plate 41 for directionally strengthened cooling of the heat dissipation substrate 2 and the power module 1; the cooling liquid after the heat transfer is exported through the flow outlet 44 on the partition plate 41 to realize rapid cooling. In the same way, the side wall of the zigzag strip protrusion 42 on the partition plate 41 renders the cross-section of the heat dissipation channel 40 to be a tapered trapezoidal structure, and cooperates with the flow inlet 43 and the flow outlet 44 to guide the cooling liquid, thereby changing a partial amount and flow rate of a partial cooling liquid in the manifold microchannel heat sink, and then changing the heat dissipation uniformity of the manifold microchannel heat sink. Finally, the specific structure is experimentally demonstrated and optimized through finite element software simulation and optimization algorithms, which further improves the heat dissipation performance of the manifold microchannel heat sink.

It should be noted that relational terms herein such as "first" and "second" are only used to distinguish one entity or operation from another entity or operation, and do not necessarily require or imply that there is such an actual relationship or order between these entities or operations. Furthermore, terms like "comprise", "include" or any other variation thereof is intended to indicate a non-exclusive inclusion such that a process, method, article, or apparatus including a set of elements includes not only those elements, but also includes other elements not expressly listed, or elements inherent in such a process, method, article, or apparatus. Without further limitations, an element defined by the phrase "comprising a . . . " does not exclude the presence of additional identical elements in the process, method, article or apparatus comprising the element.

Although the embodiments of the present disclosure are shown and described above, those skilled in the art shall understand that various changes, modifications and substitutions can be made to these embodiments without departing from the principle and spirit of the present disclosure. The scope of the invention is defined by the appended claims and their equivalents.

What is claimed is:

1. A manifold microchannel heat sink based on directional optimization of hotspot areas, comprising a power module (1), wherein the manifold microchannel heat sink based on directional optimization of hotspot areas further comprises a heat dissipation substrate (2), a cold source device (3), and a diverter manifold (4);
   the heat dissipation substrate (2) is arranged on the power module (1), and a microchannel (20) is provided on a side of the heat dissipation substrate (2) away from the power module (1) and on a back of a heat generating area of the power module (1) for carrying the power module (1) and dissipating heat from the power module (1);
   the cold source device (3) is spaced from the heat dissipation substrate (2) and is configured to generate a cold flow and dissipate heat from the heat dissipation substrate (2);
   the diverter manifold (4) is arranged between the heat dissipation substrate (2) and the cold source device (3), communicates with the microchannel (20) on the heat dissipation substrate (2) to form a heat dissipation channel (40), and is configured to cooperate with the cold source device (3) to perform directionally enhanced cooling on the heat dissipation substrate (2);
   the diverter manifold (4) comprises a partition plate (41), a zigzag strip protrusion (42), a flow inlet (43), and flow outlet (44);
   the partition plate (41) is arranged on a side of the heat dissipation substrate (2) away from the power module (1), and seals an edge of the microchannel (20);
   the zigzag strip protrusion (42) is arranged on a side of the partition plate (41) away from the heat dissipation substrate (2), and a side wall of the zigzag strip protrusion (42) renders a cross-section of the heat dissipation channel (40) to be a gradually contracted trapezoidal structure;
   the flow inlet (43) communicating with the microchannel (20) is provided on the partition plate (41) and on a convex area side of the zigzag strip protrusion (42), and the flow inlet (43) communicates with the cold source device (3); and
   the flow outlet (44) communicating with the microchannel (20) is provided on the partition plate (41) and on a convex area side of the zigzag strip protrusion (42);
   the cold source device (3) is a water-cooling device, and the cold source device (3) comprises a second base (33), a cooling cavity (34), a water inlet (35), and water outlet (36);
   the second base (33) is arranged on a side of the partition plate (41) away from the heat dissipatgion substrate (2);
   the cooling cavity (34) is provided in the second base (33), and the zigzag strip protrusion (42) abuts against an inner wall of the cooling cavity (34) and divides the cooling cavity (34) into a left cavity (c) and a right cavity (d), the left cavity (c) and the right cavity (d) being communicated through the flow inlet (43), the microchannel (20), and the flow outlet (44);
   the water inlet (35) communicating with the left cavity (c) is provided on the second base (33), and
   the water outlet (36) communicating with the right cavity (d) is provided on the second base (33);
   a number, a width, and a position of the flow inlet (43) and the flow outlet (44) on the partition plate (41) in a case of optimal heat dissipation are calculated by combining finite element software simulation and optimization algorithms.

2. The manifold microchannel heat sink based on directional optimization of hotspot areas according to claim 1, wherein a heat source of a circuit on the heat dissipation substrate (2) is analyzed, and a number, a size, a topological shape, and a position of the microchannel (20) in a case of optimal heat dissipation are calculated by combining finite element software simulation and optimization algorithms.

3. The manifold microchannel heat sink based on directional optimization of hotspot areas according to claim 1, wherein the heat dissipation substrate (2), the cold source device (3), and the diverter manifold (4) are detachably assembled and connected through bolts, or are integrally formed through methods comprising 3D printing or metal welding.

* * * * *